United States Patent [19]

Kelly et al.

[11] Patent Number: 5,798,567
[45] Date of Patent: Aug. 25, 1998

[54] BALL GRID ARRAY INTEGRATED CIRCUIT PACKAGE WHICH EMPLOYS A FLIP CHIP INTEGRATED CIRCUIT AND DECOUPLING CAPACITORS

[75] Inventors: Michael G. Kelly; Pirooz Emad, both of Vancouver, Wash.

[73] Assignee: Hewlett-Packard Company, Palo Alto, Calif.

[21] Appl. No.: 915,969

[22] Filed: Aug. 21, 1997

[51] Int. Cl.[6] ........................................ H01L 23/34
[52] U.S. Cl. ........................ 257/723; 257/778; 257/780
[58] Field of Search ............................ 257/778, 691, 257/693, 686, 687, 723, 777, 724, 780

[56] References Cited

U.S. PATENT DOCUMENTS

| | | | |
|---|---|---|---|
| 4,672,421 | 6/1987 | Lin | 257/778 |
| 5,473,512 | 12/1995 | Degani et al. | 257/778 |
| 5,477,082 | 12/1995 | Buckley et al. | 257/778 |
| 5,608,262 | 3/1997 | Degani et al. | 257/777 |
| 5,635,767 | 6/1997 | Wenzel et al. | 257/778 |

*Primary Examiner*—Mahshid D. Saadat
*Assistant Examiner*—S. V. Clark
*Attorney, Agent, or Firm*—Brian R. Short

[57] ABSTRACT

A ball grid array to integrated circuit interconnection. The interconnection includes a ball grid array substrate having a first surface and a second surface. The first surface comprising a plurality of substrate interconnection conductive pads. A power supply via connects a power supply conductive pad of the first surface to a first conductive area on the second surface. A ground via connects a ground conductive pad of the first surface to a second conductive area on the second surface. A decoupling capacitor connected between the first conductive area and the second conductive area. The interconnection further comprises an integrated circuit comprising a plurality of integrated circuit conductive pads. A plurality of smaller solder balls interconnect at least one of the integrated circuit conductive pads to at least one of the substrate interconnection conductive pads. A circuit board substrate is electrically interconnected by larger solder balls to the ball grid array substrate.

8 Claims, 2 Drawing Sheets

BALL GRID ARRAY INTEGRATED CIRCUIT PACKAGE WHICH EMPLOYS A FLIP CHIP INTEGRATED CIRCUIT AND DECOUPLING CAPACITORS

FIELD OF INVENTION

This invention relates generally to a ball grid array (BGA) substrate. In particular, it relates to a BGA substrate interconnected with a flip chip integrated circuit which includes strategically placed power supply decoupling capacitors.

BACKGROUND

An integrated circuit requires a power supply voltage to power the integrated circuit. The power supply voltage is connected to a power supply lead of the integrated circuit through a power supply interconnection. The interconnection can be a source of emitted or received electromagnetic interference (EMI). That is, high frequency electronic signals operating within the integrated circuit can emit EMI through the power supply interconnection, or the power supply interconnection can receive EMI which can affect the operation of the electronic circuitry within the integrated circuit. In general, EMI can be reduced by minimizing the length of the interconnection. Further, power supply de-coupling capacitors can be connected to the power supply interconnection to attenuate EMI coupled onto the integrated circuit power supply.

Various types of integrated circuit packaging provide varying levels of EMI suppression. The amount of EMI associated with an integrated circuit package is generally dependent upon the physical distance between the power supply lead of the integrated circuit and the decoupling capacitor electrically connected to the power supply lead.

FIG. 1 shows a prior art plastic quad flat pack integrated circuit package. The package includes an integrated circuit 10 which is electrically connected to an integrated circuit substrate 14 through bonding wires 12. The integrated circuit substrate 14 is electrically connected to a circuit board 18 through lead frame leads 16. Decoupling capacitors 20 are connected between a power supply voltage and a circuit ground on the circuit board 18. A plastic molding 22 encapsulates the integrated circuit 10.

The integrated circuit package shown in FIG. 1 provides poor EMI suppression because the decoupling capacitors 20 are located so far away from the integrated circuit 10 power supply leads. The interconnection between the decoupling capacitors 20 and the power supply leads includes the bonding wires 12, the lead frame leads 16, conductive traces on the circuit board 18 and conductive traces on the integrated circuit substrate 14.

FIG. 2 shows a prior art ball grid array integrated circuit package. This integrated circuit package provides better EMI suppression than the plastic quad flat pack integrated circuit package shown in FIG. 1. The electrical interconnections provided by the lead frame leads 16 of FIG. 1 are provided by solder balls 24. The solder balls 24 provide a shorter interconnection and provide more flexibility in the placement of the interconnection. The result is a reduction in the length of the interconnection between the decoupling capacitors 20 and the integrated circuit 10 power supply leads.

FIG. 3 shows a prior art enhanced ball grid array integrated circuit package. This integrated circuit package provides better EMI suppression than the plastic quad flat pack integrated circuit package shown in FIG. 1, and the ball grid array integrated circuit package shown in FIG. 2. The decoupling capacitors 20 of the integrated circuit package shown in FIG. 3 are located on the integrated circuit substrate 14. Therefore, the length of the interconnection between the decoupling capacitors 20 and the integrated circuit 10 power supply leads only includes the bonding wires 12 and conductive traces on the integrated circuit substrate 14.

It is desirable to have an integrated circuit package which minimizes the length of the power supply interconnection to the integrated circuit. Further, it is desirable that the integrated circuit package allow decoupling capacitors to be placed physically close to the power supply interconnection.

SUMMARY OF THE INVENTION

The present invention includes an integrated circuit package which helps minimizes the EMI associated with the integrated circuit. The integrated circuit package minimizes the length of power supply interconnections and provides power supply decoupling capacitors in close proximity to the power supply interconnections.

A first embodiment of the invention includes a ball grid array interconnection. The interconnection includes a ball grid array substrate having a first surface and a second surface. The first surface comprising a plurality of substrate interconnection conductive pads. A power supply via connects a power supply conductive pad of the first surface to a first conductive area on the second surface. A ground via connects a ground conductive pad of the first surface to a second conductive area on the second surface. A decoupling capacitor connected between the first conductive area and the second conductive area. The interconnection further comprises an integrated circuit comprising a plurality of integrated circuit conductive pads. A plurality of smaller solder balls interconnect at least one of the integrated circuit conductive pads to at least one of the substrate interconnection conductive pads. A circuit board substrate is electrically interconnected by larger solder balls to the ball grid array substrate.

A second embodiment is similar to the first embodiment. The second embodiment includes the solder bumps forming the electrical interconnection between the circuit board substrate and the ball grid array substrate being attached to the first surface of the ball grid array substrate.

A third embodiment is similar to the first embodiment. The third embodiment includes the solder bumps forming the electrical interconnection between the circuit board substrate and the ball grid array substrate being attached to the second surface of the ball grid array substrate.

Other aspects and advantages of the present invention will become apparent from the following detailed description, taken in conjunction with the accompanying drawings, illustrating by way of example the principles of the invention.

DETAILED DESCRIPTION

Figure 1:
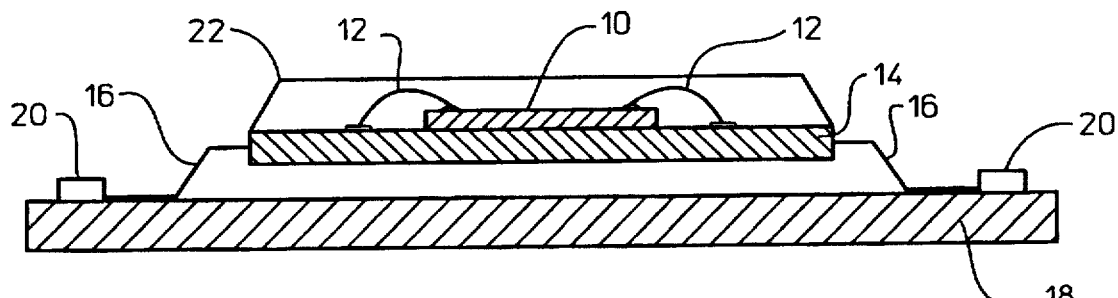
FIG. 1 shows a prior art plastic quad flat pack integrated circuit package attached to a circuit board.

As shown in the drawings for purposes of illustration, the invention is embodied in an integrated circuit package. The package minimizes the distance between a power supply lead or terminal of the integrated circuit, and a decoupling capacitor connected to a power supply line to the integrated circuit. The package also minimizes the distance between electrical ground terminals of the integrated circuit and the decoupling capacitor connection to a ground. This in turn minimizes the total area encompassed by the electrical path formed from the decoupling capacitor to the power supply line of the integrated circuit, through the integrated circuit to the ground terminals of the integrated circuit and back to the decoupling capacitor.

Integrated circuit voltage power supply decoupling capacitors filter undesired electronic signals which have been coupled onto the power supply voltage of the integrated circuit. The closer the decoupling capacitor is to the power supply lead of the integrated circuit, the more effective the decoupling capacitor is at filtering undesired electronic signals.

A type of undesired electronic signal is EMI. In general, EMI can be reduced by minimizing the length of the integrated circuit power supply voltage interconnection and by connecting power supply decoupling capacitors proximate to the power supply lead of the integrated circuit.

Figure 4:
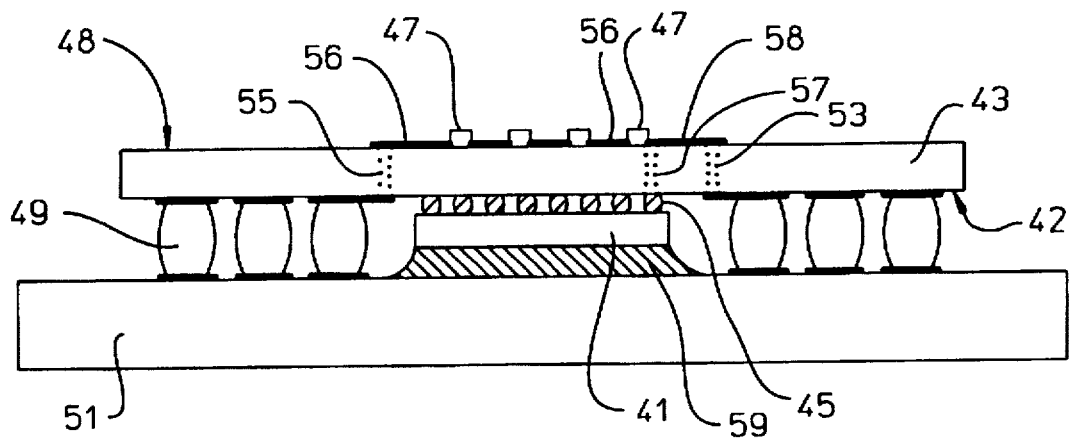
FIG. 4 shows an embodiment of the invention.

FIG. 4 shows an embodiment of the invention. This embodiment includes a flip chip integrate circuit 41 attached to a first surface 42 of the BGA substrate 43. The electrical interconnections of the integrated circuit 41 to the BGA substrate 43 are formed by eutectic solder balls 45. Power supply decoupling capacitors 47 are attached to a second surface 48 of the BGA substrate 43. A second set of larger solder balls 49 electrically interconnect the first surface of the BGA substrate 43 to a circuit board substrate 51.

The attachment of flip chips to substrates is a process which is well known in the art. For this embodiment, the flip chip integrated circuit 41 is generally attached to the BGA substrate 43 before the BGA substrate 43 is attached to the circuit board substrate 51. The attachment of the power supply decoupling capacitors 47 can occur either before or after the attachment of the BGA substrate 43 to the circuit board substrate 51.

The BGA substrate 43 includes at least one power supply via 53 and at least one ground via 55. The decoupling capacitors 47 are connected between a ground conductive area 56 and a power supply conductive area 58 on the second surface 48. The ground conductive area 56 and the power supply conductive area 58 are electrically connected to the power supply via 53 and the ground via 55. A second power supply via 57 is used to couple the power supply voltage directly from the decoupling capacitors 47 to the integrated circuit 41. The decoupling capacitors 47 can be standard surface mount technology (SMT) capacitors.

As FIG. 4 illustrates, the distance between the integrated circuit 41 and the decoupling capacitors 47 is only limited by the thickness of the BGA substrate 43 and the height of the solder balls 45. Alternatively stated, the distance between the integrated circuit 41 and the decoupling capacitors 47 is only limited by the distance between the integrated circuit 41 and the second surface 48 of the BGA substrate 43.

A configuration of the embodiment of the invention shown in FIG. 4 includes the second surface 48 of the BGA substrate 43 having voltage power supply and ground conductive traces exclusively. That is, no conductive traces or conductive regions exists on the second surface except for usage as power supply or ground distribution. Therefore, this configuration provides more flexibility in the power supply distribution of the integrated circuit package. This flexibility allows for optimal placement of the decoupling capacitors.

Another embodiment includes a conductive adhesive 59 between the integrated circuit 41 and the circuit board 51. The conductive adhesive 59 conducts heat from the integrated circuit 41 to the circuit board 51. The process of injecting conductive adhesives between integrated circuits and circuit boards is well known in the art.

Figure 5:
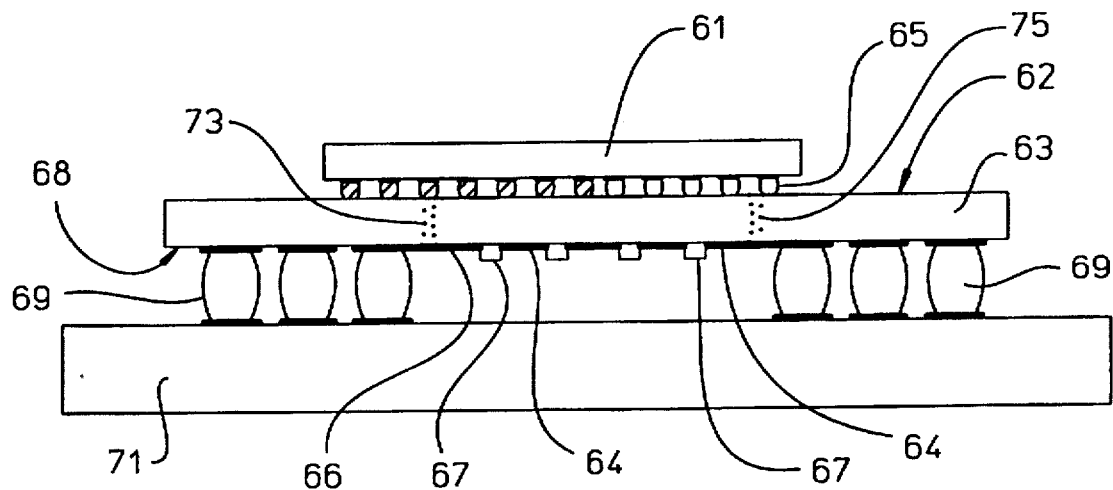
FIG. 5 shows another embodiment of the invention.

FIG. 5 shows another embodiment of the invention. This embodiment includes a flip chip integrated circuit 61 attached to a first surface 62 of the BGA substrate 63. The electrical interconnections of the integrated circuit 61 to the BGA substrate 63 are formed by eutectic solder balls 65. Power supply decoupling capacitors 67 are attached to a second surface 68 of the BGA substrate 63. Unlike the first embodiment of the inventions, this embodiment includes a second set of solder balls 69 which electrically interconnect the second surface of the BGA substrate 63 to a circuit board substrate 71.

The BGA substrate 63 includes at least one power supply via 73 and at least one ground via 75. The decoupling capacitors 67 are connected between a ground conductive area 64 and a power supply conductive area 66 on the second surface 68. The ground conductive area 64 and the power supply conductive area 66 are electrically connected to the power supply via 73 and the ground via 75. The decoupling capacitors 67 can be SMT capacitors.

The embodiment of the invention shown in FIG. 5 provides more flexibility in the size and placement of the integrated circuit 61 than the embodiment shown in FIG. 4. The distribution of the power supply and the ground on the second surface 68 of the BGA substrate 63 can be optimized to allow for minimal distance between the decoupling capacitors and the integrated circuit 63.

Figure 2:
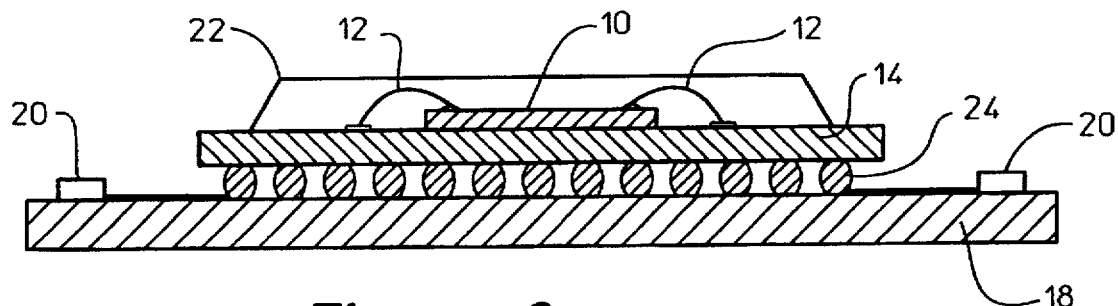
FIG. 2 shows a prior art ball grid array integrated circuit package attached to a circuit board.
Figure 3:
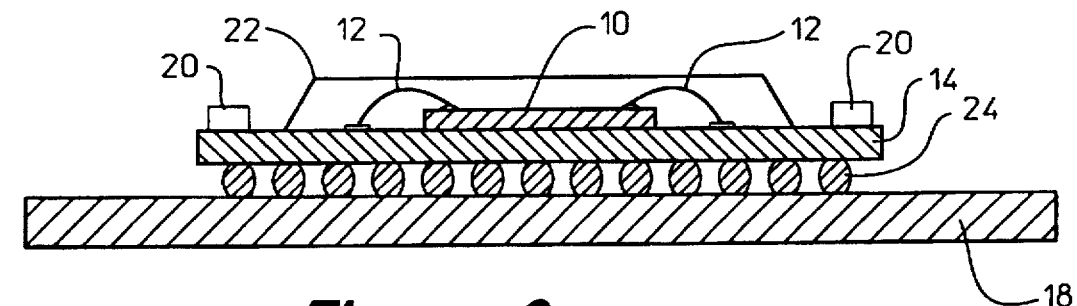
FIG. 3 shows a prior art enhanced ball grid array integrated circuit package attached to a circuit board.

The embodiments of the invention shown in FIG. 4 and FIG. 5 provide integrated circuit power supply interconnections which are shorter than integrated circuit power supply interconnections of the prior art embodiments shown in FIGS. 1–3. Therefore, the embodiments of the invention shown in FIG. 4 and FIG. 5 provide EMI suppression which is better than can be provided by the embodiments shown in FIGS. 1–3.

Antennas are formed by coupling loops created by the ground conductive area, the power supply conductive area, the power supply vias, the ground vias, the integrated circuit and the coupling capacitors. The embodiments of the invention shown in FIG. 4 and FIG. 5 provide coupling loops which are smaller than coupling loops formed by the prior art embodiments shown in FIGS. 1–3. The invention allows the coupling capacitors to be located closer to the power supply and ground connections of the integrated circuit. Therefore, the coupling loops are smaller. Smaller coupling loops are less likely to receive or emit EMI than larger coupling loops.

The prior art uses gold bonding wires to electrically interconnect the integrated circuit to the BGA substrate. The attachment of the gold bonding wires to the BGA substrate requires bonding pads on the BGA substrate to be nickel and gold plated. The embodiments of this invention include eutectic solder balls which provide the electrical interconnections between the integrated circuit and the BGA substrate which do not require nickel and gold plated pads. Therefore, the invention does not require nickel and gold plating of the pads on the BGA substrate. Further, attachment of eutectic solder balls to pads on the BGA substrate does not require the temperature extremes that bonding gold wires to pads on the BGA substrate requires. The lack of temperature extremes allows for the usage of less expensive BGA substrates.

Standard and enhanced BGA integrated circuit structures require casting plastic overmold over the integrated circuit and the bonding wires. The overmold protects the bonding wires and provides a flat surface from which to pick up the integrated circuit. The plastic overmold is applied to only one side of the BGA substrate. As a result, the BGA substrate undergoes some warpage due to the shrinkage of the plastic and the non-symmetrical design. Flip chips do not require gold bonding wires. Therefore, an extensive overmold is not required. Flip chips, however, generally require an underfill material for structural support. The overmold and the underfill material compositions are similar, but the area of the substrate in contact with the underfill is much smaller than the area in contact with the overmold. The result is reduction of BGA substrate warpage due to shrinkage of the overmold. Additionally, the second surface 48 of the BGA substrate 43 of embodiment shown in FIG. 4 provides a flat surface for picking up the integrated circuit structure for assembly to the circuit board 71. Care, however, must be exercised to keep the decoupling capacitors outside of the region required for picking up the integrated circuit structure. The backside of the integrated circuit 61 of the embodiment shown in FIG. 5 provides a flat surface for picking up the integrated circuit structure.

An integrate circuit may include several different power supply voltages. It may be desirable to separately decouple each of the power supply voltages with a decoupling capacitor while maintaining the close proximity of the decoupling capacitor to the respective integrated circuit power supply. A flip chip integrated circuit structure provides room under the integrated circuit which is available for routing of the power supply voltages. This, in combination with the local decoupling capacitors permits separate decoupling of the individual power supplies. With standard and enhanced BGA construction in which the integrated circuit is wire bonded to the BGA substrate, this is more difficult.

Although specific embodiments of the invention have been described and illustrated, the invention is not to be limited to the specific forms or arrangements of parts so described and illustrated. The invention is limited only by the claims.

What is claimed is:

1. A ball grid array interconnection comprising:
   a ball grid array substrate having a first surface and a second surface, the first surface comprising a plurality of substrate interconnection conductive pads;
   at least one power supply via connecting a power supply conductive pad of the first surface to a first conductive area on the second surface;
   at least one ground via connecting a ground conductive pad of the first surface to a second conductive area on the second surface;
   at least one decoupling capacitor connected between the first conductive area and the second conductive area;
   an integrated circuit comprising a plurality of integrated circuit conductive pads;
   a plurality of smaller solder balls interconnecting at least one of the integrated circuit conductive pads to at least one of the substrate interconnection conductive pads; and
   a circuit board substrate electrically interconnected by larger solder balls to the ball grid array substrate.

2. The ball grid array interconnection as recited in claim 1, wherein the solder bumps forming the electrical interconnection between the circuit board substrate and the ball grid array substrate are attached to the first surface of the ball grid array substrate.

3. The ball grid array interconnection as recited in claim 1, wherein the solder bumps forming the electrical interconnection between the circuit board substrate and the ball grid array substrate are attached to the second surface of the ball grid array substrate.

4. The ball grid array interconnection as recited in claim 1, wherein a minimum distance between the at least one decoupling capacitor and the integrated circuit is only limited by a distance between the integrated circuit and the second surface.

5. The ball grid array interconnection as recited in claim 2, wherein a conductive adhesive fills a space between the integrated circuit and the circuit board substrate.

6. The ball grid array interconnection as recited in claim 1, wherein a coupling loop is formed by the first conductive area connected to a power supply via, the power supply via connected to the power supply conductive pad, the power supply conductive pad connected to the integrated circuit, the integrated circuit connected to the ground conductive pad, the ground conductive pad connected to a ground via, the ground via connected to the second conductive area, and the second conductive area connected to the first conductive area through a coupling capacitor.

7. The ball grid array interconnection as recited in claim 6, wherein a length of the coupling loop is minimized.

8. The ball grid array interconnection as recited in claim 6, wherein an area encompassed by the coupling loop is minimized.

* * * * *